(12) United States Patent
Demeneghi et al.

(10) Patent No.: US 12,340,971 B2
(45) Date of Patent: Jun. 24, 2025

(54) MICROSCOPE STAGE FIXTURE FOR HORIZONTAL ROTATION

(71) Applicants: Gabriel Demeneghi, Huntsville, AL (US); Jeffrey Scott Quick, Toney, AL (US)

(72) Inventors: Gabriel Demeneghi, Huntsville, AL (US); Jeffrey Scott Quick, Toney, AL (US)

( * ) Notice: Subject to any disclaimer, the term of this patent is extended or adjusted under 35 U.S.C. 154(b) by 277 days.

(21) Appl. No.: 18/188,544

(22) Filed: Mar. 23, 2023

(65) Prior Publication Data
US 2024/0321546 A1 Sep. 26, 2024

(51) Int. Cl.
H01J 37/20 (2006.01)
H01J 37/28 (2006.01)

(52) U.S. Cl.
CPC ........... *H01J 37/20* (2013.01); *H01J 37/28* (2013.01); *H01J 2237/20214* (2013.01)

(58) Field of Classification Search
CPC ................................................ H01J 37/20
USPC .................................. 250/441.11, 442.11
See application file for complete search history.

(56) References Cited

U.S. PATENT DOCUMENTS

| | | | | |
|---|---|---|---|---|
| 3,342,994 A * | 9/1967 | Langerhorst | ........... | H01J 37/20 |
| | | | | 250/442.11 |
| 3,419,717 A * | 12/1968 | Mills | ...... | H01J 37/20 |
| | | | | 250/442.11 |
| 5,093,578 A * | 3/1992 | Tappel | .......... | H01J 37/18 |
| | | | | 250/441.11 |
| 5,530,253 A * | 6/1996 | Nishioka | .............. | B82Y 35/00 |
| | | | | 250/442.11 |
| 5,559,329 A * | 9/1996 | Joseph | .......... | H01J 37/20 |
| | | | | 73/842 |
| 6,590,212 B1 * | 7/2003 | Joseph | ......... | H01J 37/256 |
| | | | | 250/311 |
| 7,635,844 B2 * | 12/2009 | Joseph | ......... | B81C 99/003 |
| | | | | 250/311 |
| 7,765,868 B2 * | 8/2010 | Pirsch | ............... | G02B 21/24 |
| | | | | 359/398 |
| 8,585,112 B2 * | 11/2013 | Kawakami | ........ | H01J 37/20 |
| | | | | 294/902 |
| 8,829,470 B2 * | 9/2014 | Tůma | ................ | H01J 37/20 |
| | | | | 250/311 |
| 8,878,144 B2 * | 11/2014 | Yaguchi | ........... | H01J 37/26 |
| | | | | 250/443.1 |
| 2021/0285899 A1 * | 9/2021 | Danilatos | ........ | G01N 23/20025 |

\* cited by examiner

*Primary Examiner* — Jason L Vaughan

(57) ABSTRACT

A stage fixture comprising a base, clamp, flexible shaft, and a knob/controller. The device attaches to a microscope stage and secures a component cantilevered for analysis. This allows to remotely control the horizontal rotation of components without the need to physically handle the component once it is set it place.

4 Claims, 4 Drawing Sheets

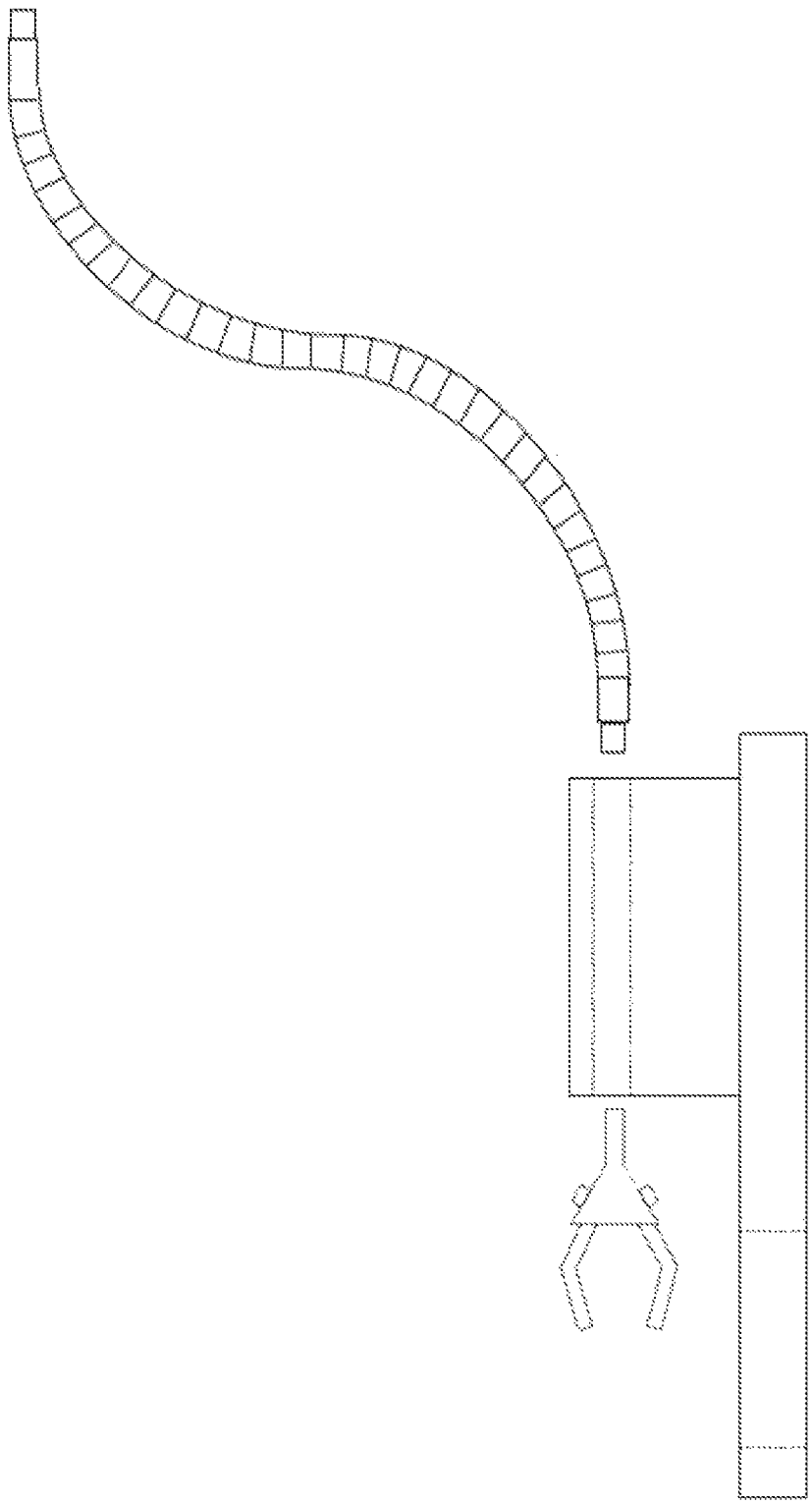

MICROSCOPE STAGE FIXTURE FOR HORIZONTAL ROTATION

STATEMENT REGARDING FEDERALLY SPONSORED RESEARCH OR DEVELOPMENT

The invention described herein was made by employees of the United States Government and may be manufactured and used by or for the Government of the United States of America for governmental purposes without the payment of any royalties thereon or therefor.

CROSS-REFERENCE TO RELATED APPLICATIONS

Not Applicable

REFERENCE TO A SEQUENCE LISTING, A LARGE TABLE, OR A COMPUTER PROGRAM LISTING APPENDIX ON READ-ONLY OPTICAL DISC

Not Applicable

BACKGROUND OF THE INVENTION

1. Field of the Invention

The invention herein relates to the investigation of components using microscopes. More specifically, the invention allows for the component to be horizontally rotated through a remote knob/control while still remaining fixed in for observation.

2. Description of the Related Art

Microscopy is used across virtually every industry in the world. Microscopy is used in multiple industries to confirm manufacturing operation procedures, component quality inspection, failure investigations, research and development, among others. Among microscopy techniques, there is the scanning electron microscope (SEM).

The SEM produces an electron beam that travels through vacuum and hits the specimen's surface, generating x-rays, backscatter electrons, and secondary electrons that are collected by detectors, which in turn, convert them to a signal and form an image of the exposed area. SEM allows the surface of components to be observed at magnification not possible through visible light (i.e., surface of a human hair, nano sized features). To operate a SEM, a specimen is typically clipped to a stage, air is pumped out, to create a vacuum environment, before focusing the electron beam on the specimens, and to view the image on a monitor.

While almost every SEM platform within the chamber has some basic x-y-z translation, z rotational capabilities, and some stage tilt, it's not possible to move the sample 360 degrees. To zoom in on other regions of the sample surface, it's necessary to open the chamber, remove and re-clip the specimen in a new position, and repeat the pump-down before a viewing will be possible. Each vent-reposition-pump cycle takes several minutes (varying depending upon the size of the SEM chamber), which significantly increases the required time to perform an investigation.

Another challenge to the current approach is the fact that by physically maneuvering the specimen it is easy to lose sight of the location last analyzed, leading to duplicate scans and/or additional time to find the right location to be analyzed. Furthermore, handling the specimen to rotate a few degrees for each location to be analyzed significantly increases the risk of contaminating and damaging the specimen, as each repositioning requires the specimen to be removed and re-clipped to the SEM stage.

BRIEF SUMMARY OF THE INVENTION

Accordingly, the object of the present invention, the Microscope Stage Fixture for Horizontal Rotation, is a fixture that secures objects on one end (cantilever) and enables their rotation along the horizontal axis with respect to the vertical axis.

In accordance with the present invention, the stage fixture for horizontal rotation consists of a base that is attached to the existing microscope platform. It has a cantilever arm capable of rotating 360 degrees with an adjustable clamp on the end to secure the component for analysis and a flexible shaft-knob assembly on the other end for remote rotation adjustment. In the case of an SEM, the adjustment knob protrudes from the side of the SEM chamber without breaking the vacuum seal. Turning the knob moves the sample (held in by the clamp) rotating it around as much as needed in either direction.

This kind of flexible system is required to avoid damaging the microscope platform or the rotating assembly and more easily move it around and reposition in different microscopes. Once attached to the microscope's platform, the 360-degree rotation makes inspection of the surface of almost any component quicker and easier.

The invention herein intends to increase productivity and reduce risks associated with microscopy investigations. The primary benefits to the microscopist are (1) operator time savings, (2) reducing analysis time by ~70%, (3) reducing the risk of contamination, and (4) reducing the risk of damage that occurs with frequent handling of the test object.

Figure 1:
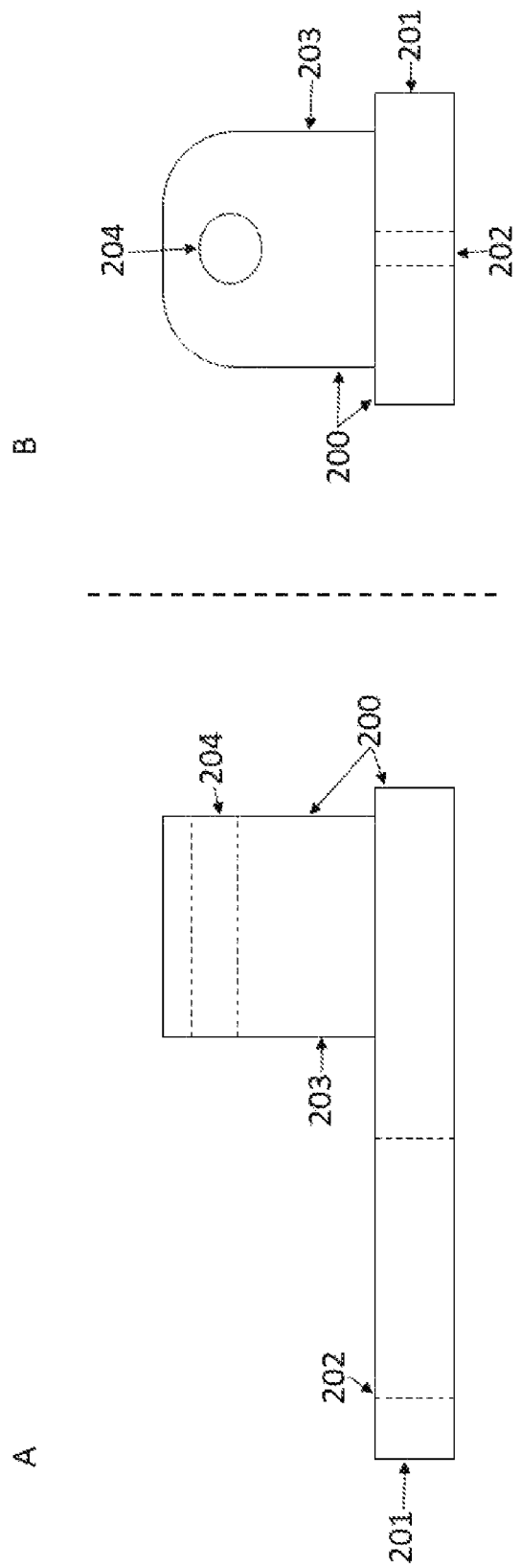
FIG. 1 (Body): The body base is illustrated in FIG. 1.

The body consists of an aluminum fixture 200 comprising of aluminum flatbed 201 with a long slot 202 to attach to the microscope stage through a set screw or stage adapter, depending on the microscope stage. The body also has an elevated aluminum section 203 to secure the flexible shaft and clamp with a through-hole 204 that allows for the specimen to be rotated without interfering with the microscope stage, body's flatbed screw, or stage adapter.

Views of FIG. 1 include:

FIG. 1A is a side view of the body of the fixture.

FIG. 1B is a front view of the body of the fixture.

Figure 2:
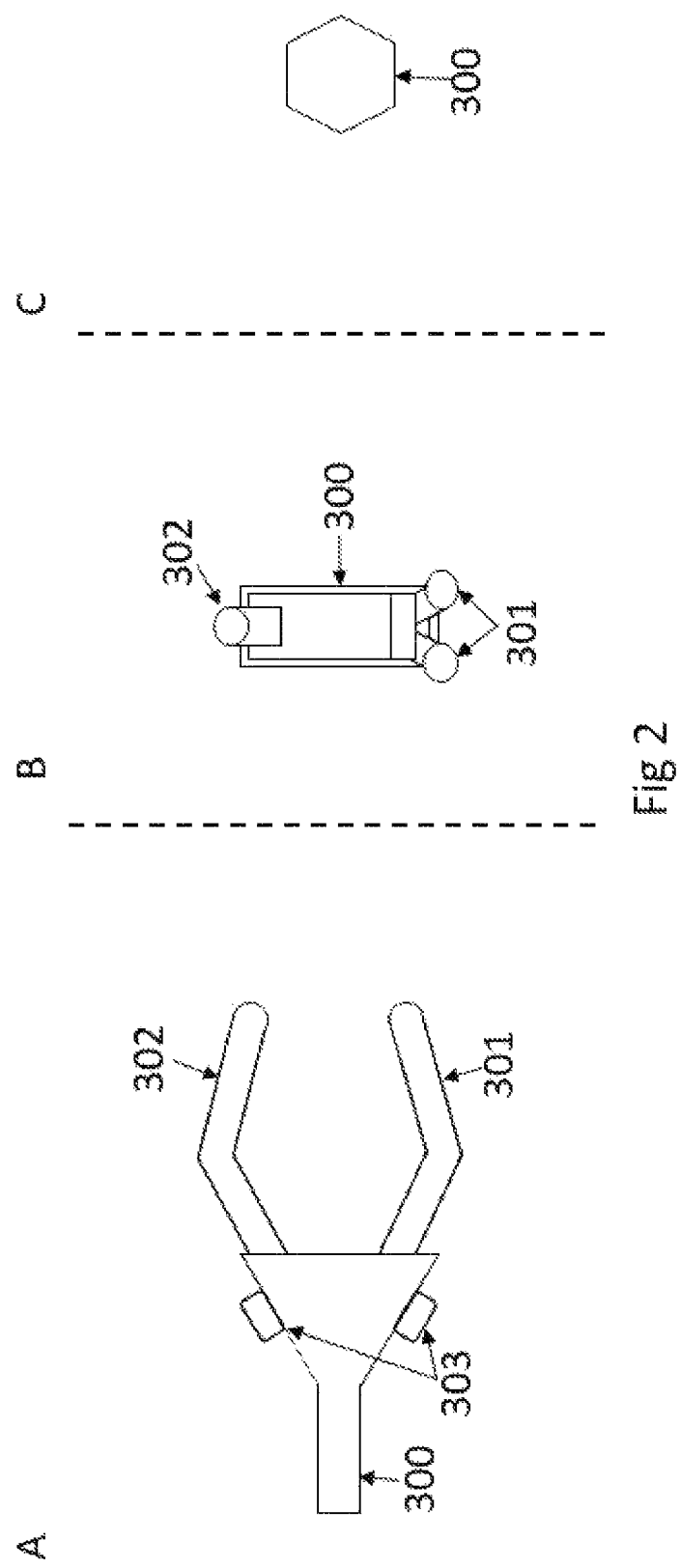

FIG. 2 (Clamp): The clamping device is illustrated in FIG. 2. The clamp comprises a body with a shaft 300 that houses two clamping fingers 301 adjacent to one clamping finger 302. The clamp fingers are adjusted by screws to accommodate for a variety of different size components and to ensure the components are securely tightened and held in place, preventing from falling or moving around during the investigation.

The clamp attaches to the flexible shaft and is held in the body. The clamp is used to hold the specimen on one end, cantilevered, to the flexible shaft, allowing the specimen to be freely rotated around the horizontal axis.

Views of FIG. 2 include:

FIG. 2A is a side view of the clamp of the fixture.

FIG. 2B is a front view of the clamp of the fixture.

FIG. 2C is a back view of the clamp of the fixture.

Figure 3:
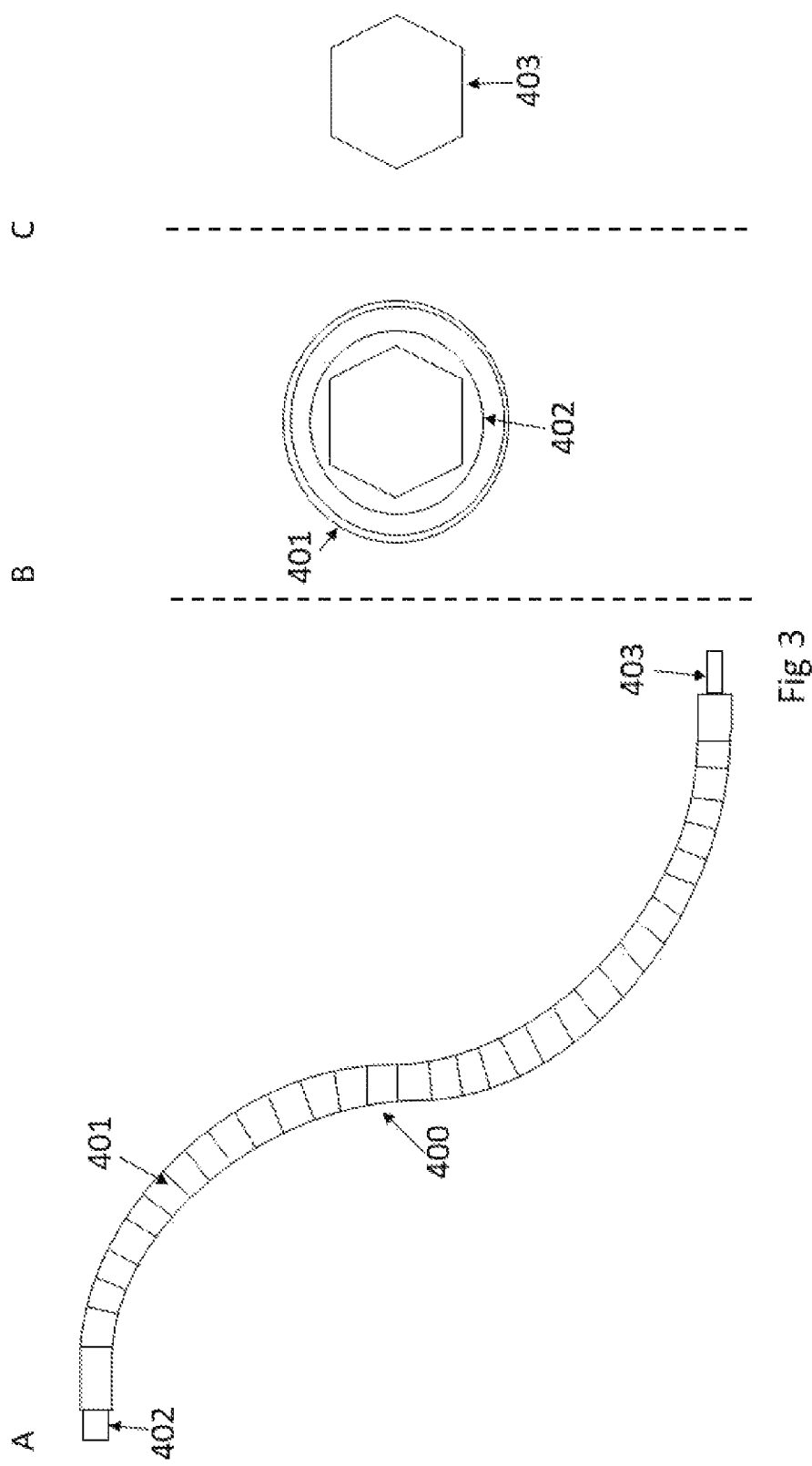

FIG. 3 (Flexible Shaft): The flexible shaft is illustrated in FIG. 2. The flexible shaft 400 comprises a core, free to rotate, and a static shell 401 to be secured to the body without hindering the core's motion. The flexible shaft is secured to the body by a through hole and held in place by a set screw on the side of the body's elevated section. The flexible shaft has a "female" fitting core 402 on one end that is coupled to the clamping device shaft to transmit the motion from the shaft to the clamping device. On the other end, the flexible shaft's core has an extruded shaft to be attached to the knob, allowing the rotation to be transmitted from the knob to the clamp holding the specimen.

The flexibility of the shaft allows for the microscope's stage to be translated in the horizontal and vertical directions without endangering other microscope parts, i.e., detectors inside the SEM chamber.

Views of FIG. 3 include:
FIG. 3A is a side view of the flexible shaft of the fixture.
FIG. 3B is a front view of the flexible shaft of the fixture.
FIG. 3C is a back view of the flexible shaft of the fixture.
FIG. 4 (Assembly): The assembly e is illustrated in FIG. 4.

The assembly consists of aluminum base that attaches to a microscope stage, a clamp that secures the components in place for analysis, a flexible shaft that transmits the motion from the knob/controller to the clamp, and a knob/controller (not show in FIG. 4) that the user uses to rotate the component being analyzed.

DETAILED DESCRIPTION OF THE INVENTION

The invention refers to a Microscope Stage Fixture for Horizontal Rotation, a stage that secures objects and enables their rotation along the x-y axis with respect to the z-axis. The rotating microscope fixture is a stage attachment that secures objects and enables a 360-degree rotation along the horizontal axis without removing the object from the microscope stage.

The body base illustrated in FIG. 1 consists of an aluminum fixture 200 comprising an aluminum flatbed 201 with a long slot 202 to attach to the SEM stage through a set screw or stage adapter, depending on the SEM model. The body also has an elevated aluminum section 203 to secure the flexible shaft and clamping device with a through-hole 204 that allows for the specimen to be rotated without interfering with the SEM stage, body's flatbed screw, or stage adapter.

The body attaches to the microscope's stage using a screw or a stage adapter through the long slot on the base of the body. The body secures the flexible shaft and clamp in position through an elevated section that allows the part to be rotated without interfering with the microscope or the body's base.

The clamping device illustrated in FIG. 2 comprises a body with a shaft 300 that houses two clamping fingers 301 adjacent to one clamping finger 302. The clamp has an adjustable opening "jaw" by a screw to accommodate for a variety of different size parts and to ensure the parts are securely tightened and held in place. Preventing from falling or moving around during the investigation and operation.

The clamp attaches to the flexible shaft and is held in the body. The clamp is used to hold the specimen on one end, cantilevered, to the flexible shaft, allowing the specimen to be freely rotated around the x or y axis.

The flexible shaft 400 illustrated in FIG. 2 comprises a core free to rotate with a static shell 401 that is used to be secured to the body without hindering the core's motion. The flexible shaft has a "female" fitting core 402 on one end that is coupled with the clamping device shaft to transmit the motion from the shaft to the clamping device. On the other end, the flexible shaft's core has a shaft to be attached to the knob, allowing the rotation to be transmitted from the outside knob to the clamp holding the specimen. The flexible shaft translates the motion from the knob/controller outside of the vacuum chamber to the clamp holding the specimen under investigation.

The core of the shaft is able to move freely with a cover that can be held in place to the body without restricting its movement. The flexible shaft is secured to the body by a through hole and held in place by a set screw on the side of the elevated section.

The flexibility of the shaft allows for the microscope stage to be translated in the x-y-z directions without endangering the microscope components, i.e., detectors inside the SEM chamber.

For SEM and other vacuum systems, the vacuum feedthrough is a commercially available system that allows the shaft from the knob outside of the vacuum chamber to connect to the flexible shaft inside the chamber. The vacuum feedthrough is secured to the microscope by going through one of the detector ports. The port has to be machined to accommodate the feedthrough to be installed or a new port has to be fabricated to incorporate the feedthrough system to be adjoined. The port dimensions vary microscope model.

The knob/controller is used to rotate the part remotely, not interfering with the specimens or breaking vacuum of SEM chambers. The knob can be manually controlled as an analog knob or electronically controlled with a rotating motor for a higher precision. The rotation of the knob/controller is a 1:1 ratio with the part since the flexible shaft is only translating the motion. A higher ratio can be obtained by a gearing system either outside or inside the chamber.

To exemplify the advantages of the present invention, consider an x-y-z coordinate system where point 0,0,0 is at the center of your SEM chamber. Let positive x go to the right, positive y come out towards the door, and positive z go up towards the chambers ceiling. Using the invention, by clamping a component, such as a cylinder, it protrudes out towards the positive x or y direction. The SEM beam comes down from the top towards the negative z direction and strikes the apex of the side of the cylinder and it is possible to analyze that particular location. Next, by rotating the knob a few degrees outside the chamber, the sample rotates around that y-axis (rotate, stop to analyze, snap a micrograph, and then move on by rotating some more). This process is repeated until it is rotated 360 degrees, which returns the cylinder to the first spot analyzed. This allows for a ring around the cylinder to be mapped with the "y width" equal to the SEM spot size diameter. Other locations along the length of the cylinder could also be mapped by simply translating the SEM stage in the positive or negative y direction, or adjustments to be made along the x and z directions.

With the Microscope Stage Fixture for Horizontal Rotation, the 360-degree rotation makes inspection of the surface of almost any part quicker and easier. This tool supports high-magnification photographs that highlight material composition and surface topography. Thus, it can be used in multiple industries to confirm manufacturing operations, quality inspections, failure investigations, and others.

Due to the time needed to pull the vacuum and vent the SEM chamber, setting the specimen inside the SEM can take longer than actually characterizing it. The time requirement grows exponentially if the entire surface of the specimen needs to be inspected since each time the specimen needs to be rotated along the horizontal axis, the SEM must be vented, then the specimen must be manually rotated, next the SEM must be pumped once again, and finally, it is possible to find and re-focus on the specimen for the analysis. This process is repeated for each time the specimen needs to be rotated to inspect a different area, including high-magnification photographs that highlight material composition and surface topography.

The invention claimed is:

1. A stage fixture for use in a scanning electron microscope, comprising: a base configured to attach to an existing scanning electron microscope stage; a clamping device supporting a cantilevered component; a flexible shaft extending outside the scanning electron microscope; a mechanical knob external to the scanning electron microscope for actuating rotation of the component; a vacuum feedthrough maintaining vacuum integrity while allowing rotation of the component; a control mechanism that comprises the mechanical knob;

wherein the mechanical knob and flexible shaft are coupled to the vacuum feedthrough; and wherein the control mechanism is coupled to the flexible shaft through the vacuum feedthrough to transmit rotational input from the mechanical knob to the clamping device.

2. The stage fixture of claim 1, wherein the clamping device enables the 360-degree rotation of the cantilevered component along a long axis of the cantilevered component.

3. The stage fixture of claim 1, wherein the cantilevered component is secured by the clamping device with adjustable grips for components of varying sizes.

4. The stage fixture of claim 1, wherein the flexible shaft allows movement of the scanning electron microscope stage without restricting the range of motion of the scanning electron microscope stage.

* * * * *